United States Patent
Mueller-Hipper et al.

(10) Patent No.: US 7,714,454 B2
(45) Date of Patent: May 11, 2010

(54) CHIP MODULE AND METHOD FOR PRODUCING A CHIP MODULE

(75) Inventors: Andreas Mueller-Hipper, Regensburg (DE); Frank Pueschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 11/959,973

(22) Filed: Dec. 19, 2007

(65) Prior Publication Data
US 2008/0211087 A1  Sep. 4, 2008

(30) Foreign Application Priority Data
Dec. 20, 2006  (DE)  ............. 10 2006 060 411

(51) Int. Cl.
*H01L 23/28* (2006.01)
(52) U.S. Cl. ............................ 257/787; 438/127
(58) Field of Classification Search .............. 257/787, 257/704, 701; 438/124, 125, 126, 127
See application file for complete search history.

(56) References Cited

U.S. PATENT DOCUMENTS

| | | | | |
|---|---|---|---|---|
| 5,583,377 A | * | 12/1996 | Higgins, III | 257/707 |
| 5,909,056 A | * | 6/1999 | Mertol | 257/704 |
| 5,940,271 A | * | 8/1999 | Mertol | 361/704 |
| 6,246,111 B1 | * | 6/2001 | Huang et al. | 257/675 |
| 6,459,144 B1 | * | 10/2002 | Pu et al. | 257/667 |
| 6,707,166 B1 | * | 3/2004 | Noguchi | 257/790 |
| 6,762,509 B2 | * | 7/2004 | Hilton et al. | 257/787 |
| 6,847,111 B2 | * | 1/2005 | Yang et al. | 257/707 |
| 6,894,229 B1 | * | 5/2005 | Cheah | 174/255 |

FOREIGN PATENT DOCUMENTS

| | | |
|---|---|---|
| DE | 19535989 | 4/1997 |
| DE | 19543427 | 5/1997 |
| DE | 19619310 | 5/1997 |
| DE | 19623826 | 12/1997 |
| EP | 0766197 | 4/1997 |
| FR | 2684803 | 6/1993 |
| FR | 2799857 | 4/2001 |

* cited by examiner

*Primary Examiner*—S. V Clark
(74) *Attorney, Agent, or Firm*—Dickstein, Shapiro, LLP.

(57) ABSTRACT

A chip module comprises a substrate, a chip arranged on one side of the substrate and conductor structures arranged on at least one side of the substrate and conductively connected to the chip. At least one stiffening element is arranged on one side of the substrate and a moulding cap encapsulates at least the chip. For producing the chip module, provision is made for providing a substrate and applying conductor structures to at least one side of the substrate. At least one stiffening element is mounted onto one side of the substrate. Furthermore, a chip is mounted onto one side of the substrate and connected to the conductor structures. A moulding compound is applied on the substrate, such that the chip is covered.

11 Claims, 6 Drawing Sheets

CHIP MODULE AND METHOD FOR PRODUCING A CHIP MODULE

CROSS-REFERENCE TO RELATED APPLICATION

This Application claims priority to German Patent Application Serial No. 10 2006 060 411.3, which was filed Dec. 20, 2006 and is incorporated herein by reference in its entirety.

BACKGROUND

The invention relates to a chip module and a method for producing such a chip module.

Smart cards are used in a multiplicity of applications. A smart card usually comprises a card body and a chip module inserted into the card body. The chip module is typically produced by mounting a chip having an integrated circuit onto a substrate with conductor structures. In the case of a smart card having a contact-based interface, the conductor structures comprise contact areas that can be contact-connected by a reader. In the case of a smart card having a contactless interface, contact regions for connecting an antenna are usually provided. The integrated circuit is supplied with power and data are transmitted by means of an electromagnetic field.

In the case of applications with very thin cards or electronic documents, so-called ultrathin modules are used, the total thickness of which is typically in the region of 200 μm or less. However, robustness and flexural strength are required for such applications.

Approaches to that effect achieve the robustness by using a chip that is relatively thick. Such a chip has a height in the region of 150 μm, for example. When using a protective encapsulation applied to the chip, and a leadframe as substrate, the thickness of which is typically in the region of 80 μm, the above mentioned module height is exceeded, however, with this arrangement.

In another arrangement, a chip having such a height is mounted using flip-chip technology. Furthermore, an encapsulation is dispensed with, such that the module thickness is dominated by the chip thickness. On account of the lack of encapsulation, this arrangement is susceptible to mechanical loads, which adversely affects the quality of the corresponding smart cards since failures can occur during mounting and in operation.

In a further arrangement, the chip is mounted on a steel plate having a thickness of approximately 120 μm. In this arrangement, the contact-connection of the antenna is effected directly on the chip, which is accompanied by an increased risk of chip damage during mounting and in operation.

BRIEF DESCRIPTION OF THE DRAWINGS

The invention is explained below on the basis of exemplary embodiments with reference to the drawing.

DESCRIPTION OF THE INVENTION

The invention provides a chip module comprising a substrate, a chip on one side of the substrate and conductor structures on at least one side of the substrate, which are conductively connected to the chip. At least one stiffening element on one side of the substrate and a moulding cap, which encapsulates at least the chip, are furthermore provided.

The combination of stiffening element and protective moulding cap has the effect that the ultra thin chip module has the required robustness for use in smart cards. Furthermore, the chip module is protected both by the stiffening element and by the moulding cap.

In one configuration, the substrate is flexible in order that bending loads on the smart card with the chip module are absorbed in particular by non-encapsulated edge regions of the chip module. The stiffening element is formed from steel which is elastic but not porous.

The stiffening element or one of the stiffening elements is arranged alongside the chip or around the chip in order to obtain a frame-like protective effect. This effect is optimized by a stiffening element formed in frame-type fashion.

In one configuration, the portions of the conductor structures can be arranged between the stiffening element and the substrate in order to connect contact regions on one side of the stiffening element to the chip positioned on the other side of the stiffening element. The contact regions are not encapsulated and serve for example for the connection of an antenna or for forming a contactless interface. This is accompanied by a flatter configuration of the chip module than in exemplary embodiments with contact areas on that side of the substrate which is remote from the chip.

Chip contacts are positioned on a side of the chip that faces the substrate and are conductively connected to the conductor structures. This flip-chip contact-connection permits the flat configuration of the chip module. However, other forms of contact-connection, for example by means of bonding wires, are also conceivable.

In one configuration, the stiffening element is also encapsulated, such that the moulding cap forms a terminating top side of the chip module. A first distance between a side of the stiffening element that is remote from the substrate and one side of the substrate is less than a second distance between a side of the moulding cap that is remote from the substrate and the same side of the substrate, if the moulding cap also encapsulates the stiffening element.

In a further configuration, regions that are free of moulding material are provided between the moulding cap and the stiffening element. The second distance is greater, such that the stiffening element extends beyond the moulding cap and protects the latter against shock and impact loads.

The method according to the invention for producing an exemplary embodiment of such a chip module comprises providing a substrate and applying conductor structures to at least one side of the substrate. At least one stiffening element is mounted onto one side of the substrate. Furthermore, a chip is mounted onto one side of the substrate. The chip is connected to the conductor structures and moulding compound is applied on the substrate, such that the chip is covered.

Figure 1:
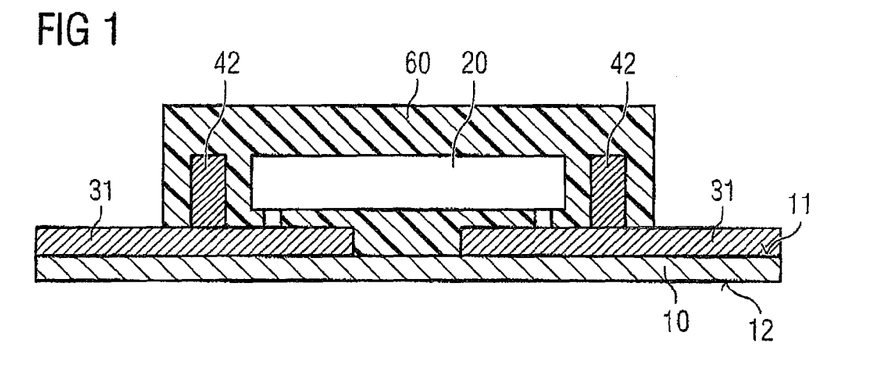
FIG. 1 shows an exemplary embodiment of a chip module in cross section.

FIG. 1 shows a schematic illustration of an exemplary embodiment of a chip module in cross section. The chip module comprises a substrate 10, a chip 20 on one side of the substrate 10 and conductor structures 31 on at least one side of the substrate 10, which are conductively connected to the chip 20. At least one stiffening element 42 on one side of the substrate 10 and a moulding cap 60, which encapsulates at least the chip 20, are furthermore provided. In this exemplary embodiment, the moulding cap 60 also encapsulates the stiffening element 42.

Figure 2:
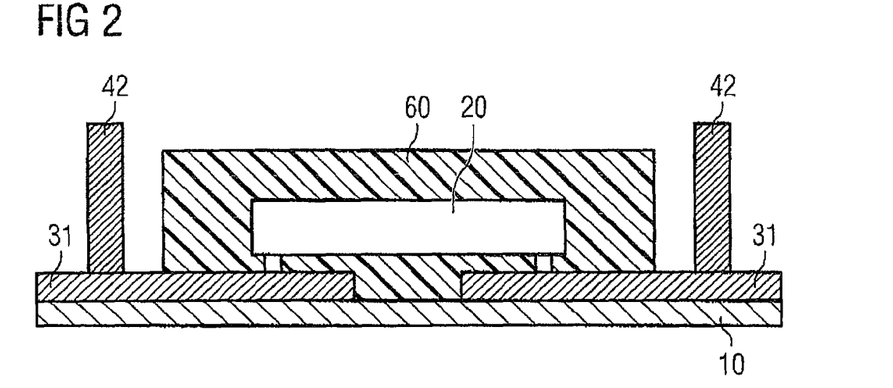
FIG. 2 shows an exemplary embodiment of a chip module in cross section.

FIG. 2 shows a further exemplary embodiment, which differs from the previous exemplary embodiment by virtue of the fact that the stiffening element 42 is arranged outside the moulding cap 60.

Figure 3:
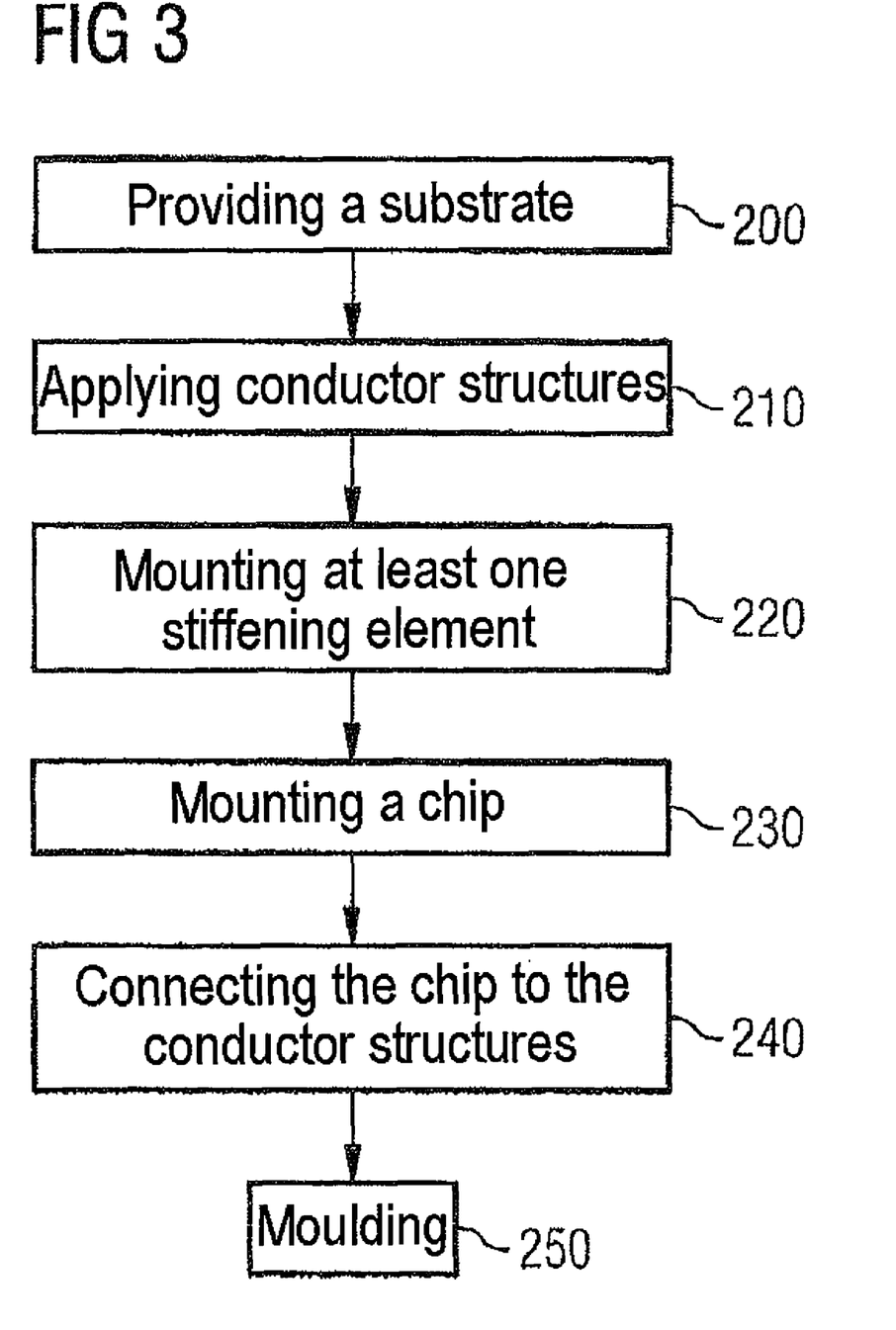
FIG. 3 shows a flowchart of a production method for an exemplary embodiment of a chip module.

The exemplary embodiment illustrated in FIG. 3 illustrates the essential steps for producing an exemplary embodiment of a chip module such as is illustrated in FIG. 1, on the basis of a flowchart.

Provision is made for providing a substrate 10, which is represented by the block 200. Conductor structures 31 are then applied to at least one side of the substrate 10, as represented by the block 210. This can be done by lamination, for example. However, any other method for applying conductor structures 31 to the substrate 10 is also suitable.

At least one stiffening element 42 is mounted onto one side of the substrate 10, which is illustrated by block 220. Block 230 illustrates that a chip 20 is mounted onto one side of the substrate 10. The mounting can be done by adhesive bonding, for example. The chip 20 is connected to the conductor structures 31, which is represented by the block 240. The connection can be effected for example using flip-chip technology or by wire bonding.

In a further exemplary embodiment, the mounting of the stiffening element 42 or of the stiffening elements can be done after the mounting and the contact-connection of the chip 20. In another exemplary embodiment, it is possible firstly to effect the mounting of the chip 20, then to effect the mounting of the stiffening element 42 or of stiffening elements, and then to effect the connection of the chip 20 to the conductor structures 31.

A moulding compound is applied on the substrate 10, such that the chip 20 is covered, which is represented by the block 250. In one exemplary embodiment, the moulding compound is applied in such a way that the stiffening element 42 is covered, such that applying the moulding cap 60 is one of the final production steps.

The encapsulation is effected by applying a moulding compound using the injection-moulding method. This is usually done by positioning a mould around the chip 20 and regions of the substrate 10, into which the moulding compound heated to approximately 180° C. to 190° C. is injected under pressure via ducts. After curing, the moulding material has the moulding cap form predetermined by the mould.

A bonded epoxy resin, to which silicon oxide fillers can be added, is used for example as the moulding compound. The moulding compound typically has a particle content of at least 70%.

Figure 4:
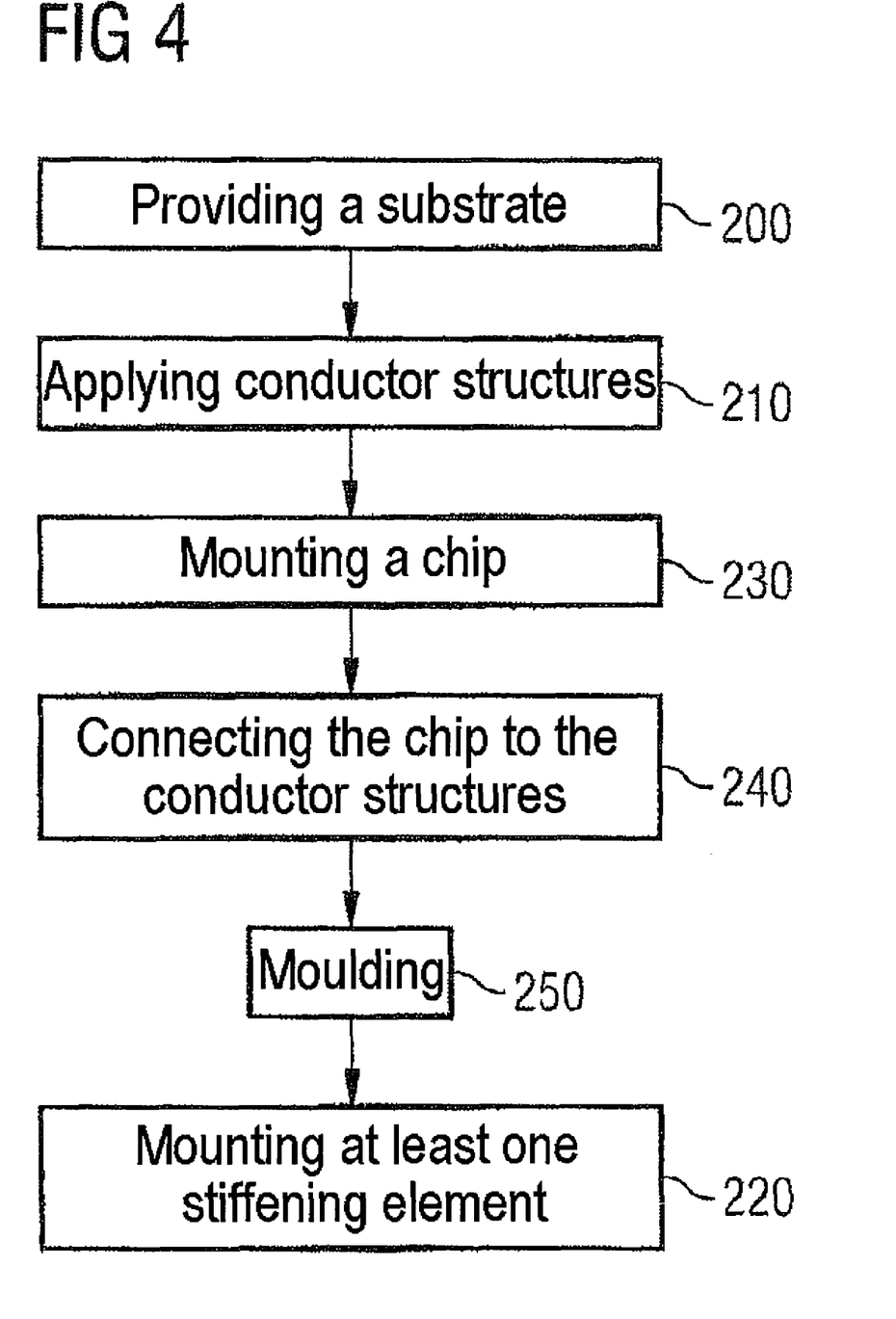
FIG. 4 shows a flowchart of a production method for a further exemplary embodiment of a chip module.

The exemplary embodiment illustrated in FIG. 4 illustrates an alternative sequence of production steps, which differs from the sequence in FIG. 3 by virtue of the fact that firstly the moulding is effected and then the stiffening element 42 is applied, such that regions of the stiffening element 42 or of one of the stiffening elements that face the chip 20 are free of moulding material. This production method is suitable for producing the exemplary embodiment of the chip module in FIG. 2.

Figure 5:
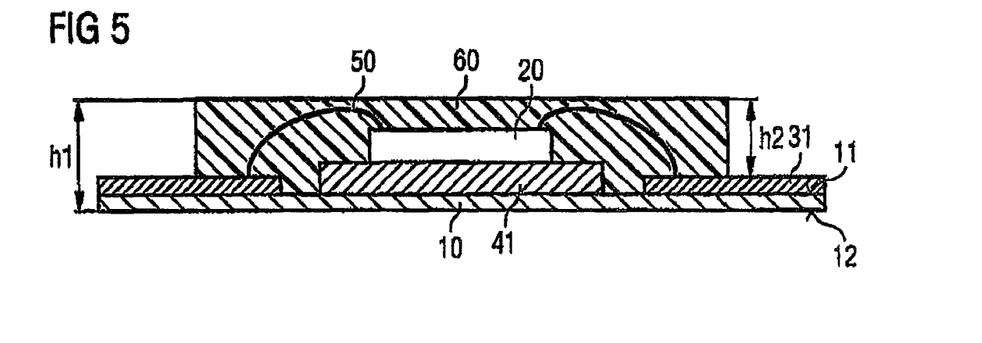
FIGS. 5 to 13 each show an exemplary embodiment of a chip module in cross section.

FIG. 5 shows a schematic illustration of an exemplary embodiment of a chip module in cross section with a substrate 10 having a first side 11 and a second side 12. By way of example, a material comprising PI, polyimides, is suitable as substrate 10. Conductor structures 31 are applied on the first side 11 of the substrate 10. Said conductor structures comprise copper, for example. However, other electrically conductive materials are also suitable.

Furthermore, a stiffening element 41 formed in plate-type fashion is provided on the first side 11 of the substrate 10. In the first exemplary embodiment, the stiffening element 41 is formed as a steel plate. A chip 20 is arranged on the stiffening element 41 and is conductively connected to the conductor structures 31 via bonding wires 50. A moulding cap 60 encapsulates the chip 20, the bonding wires 50 and regions of the conductor structures 31. The other regions of the conductor structures 31 are not encapsulated and are suitable for the contact-connection of a coil, for example.

The chip 20 is mounted onto the stiffening element 41 in order to protect the chip 20 against bending loads. The stiffening element 41 is applied in a region on one side of the substrate 10 that is free of conductor structures 31. In this way, the stiffening element 41 is applied directly on the substrate 10 and leads to no damage whatsoever if impacts or shocks occur.

It should be noted that the chip module is not illustrated to scale. The exemplary embodiment of the chip module typically has a height h1 of approximately 200 μm or less. A second height h2, by which the moulding cap 60 is elevated above the conductor structures 31, amounts approximately to 150 μm. The conductor structures 31 and also the substrate 10 each have a thickness of approximately 25 μm. The steel stiffening element 41 has a thickness in the region of 50 μm.

Such a chip module is produced by applying the conductor structures 31 to the substrate 10. After the stiffening element 41 has been applied, the chip 20 is mounted on it. Afterwards, the bonding wires 50 are fitted by wire bonding to connection pads of the chip 20 and the conductor structures 31 to be connected thereto.

Figure 6:
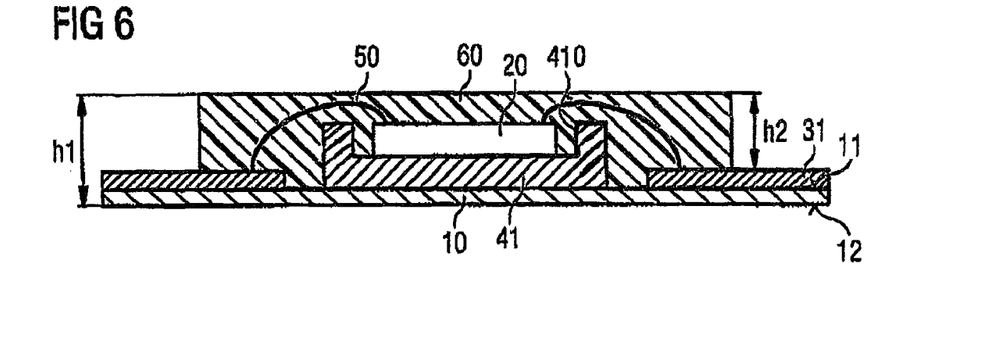

FIG. 6 schematically shows a further exemplary embodiment of a chip module in cross section. In order to avoid repetition, only the differences with respect to the exemplary embodiment in FIG. 5 are discussed. Identical reference symbols identify identical feature arrangements.

In this exemplary embodiment, a stiffening element 41 is provided which has a cavity 410, into which the chip 20 is introduced. The formation of the cavity 410 in the stiffening element 41 can be effected by etching, for example.

As an alternative, such a stiffening element 41 can also be produced by mounting a stiffening frame onto a plate, similarly to the stiffening element in the preceding exemplary embodiment, or by mounting at least two beam-type lateral elements onto a plate. The height of such a stiffening element 40 with cavity 410 is at most approximately 100 μm.

Figure 7:
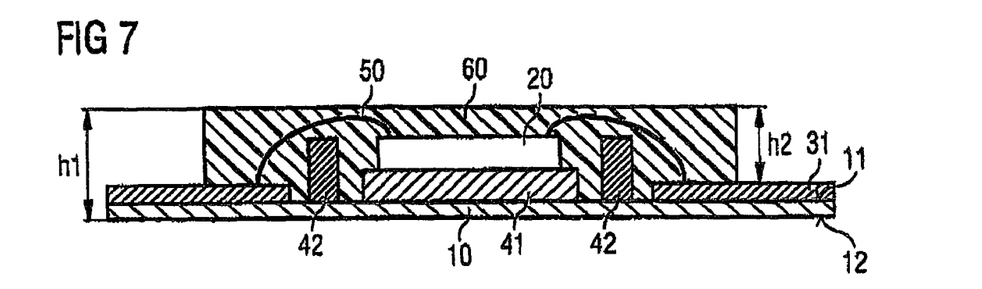

FIG. 7 schematically shows an exemplary embodiment of a chip module in cross section, which differs from the exemplary embodiment in FIG. 5 by virtue of the fact that now both a first stiffening element 41 and a second stiffening element 42 are provided. The first stiffening element 41 is formed in plate-type fashion and is positioned between the first side 11 of the substrate 10 and the chip 20. The second stiffening element 42 is formed as a steel frame and is positioned around the chip 20 on the first side 11 of the substrate 10.

In an alternative exemplary embodiment, instead of the stiffening frame 42, a plurality of second stiffening elements are provided, which are arranged around the chip. In a simple case, such stiffening elements are arranged for example in beam-type fashion and on both sides of the chip module. In cross section such an exemplary embodiment looks like the exemplary embodiment in FIG. 7.

The second stiffening element 42 of the exemplary embodiment in FIG. 7 has a height of approximately 100 μm, for example. The height of the first stiffening element 41 is in the region of 50 μm, which also corresponds to the height of the chip 20. The second stiffening element 42 enlarges the stiffened region of the chip module and additionally protects the chip 20 against shock and impact loads. The second stiffening element 42 projects above the chip 20 in order to improve the impact and shock protection effect.

Figure 8:
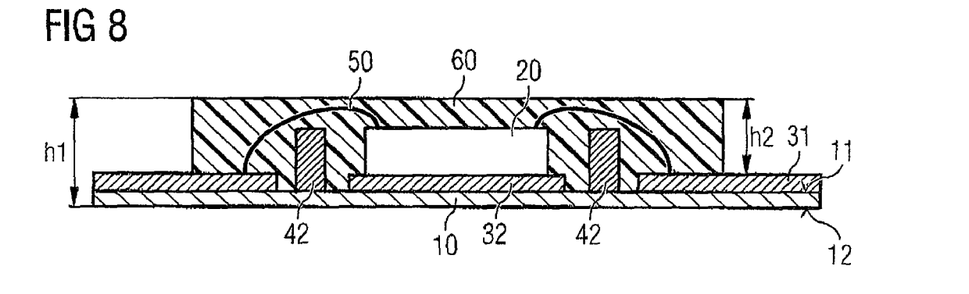

FIG. 8 schematically shows an exemplary embodiment of a chip module in cross section. This differs from the exemplary embodiment in FIG. 7 by virtue of the fact that the chip 20 is now applied on an insular region 32 of the conductor structures. Such an arrangement is suitable for using thicker chips 20, having a height of 70 μm, for example, in ultraflat chip modules. The stiffening element 42 arranged around the chip 20 is of frame-type embodiment.

The structure island 32 is applied in the same production step as the other conductor structures 31 and also has a similar thickness in the region of 25 μm.

Figure 9:
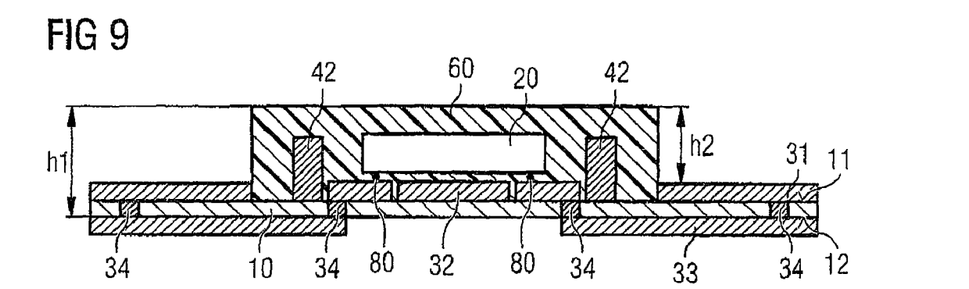

FIG. 9 schematically shows an exemplary embodiment of a chip module in cross section. This comprises a substrate 10 having a first side 11 and a second side 12. Continuous cutouts from the first to the second side 11, 12 are provided in the substrate 10.

First conductor structures 31, 32 are provided on the first side 11 of the substrate 10, with first regions 31 in an outer region of the first side 11 and second regions 32 in an inner region of the first side 11. Second conductor structures 33 are provided on the second side 12 of the substrate 10. The first conductor structures 31, 32 and the second conductor structures 33 are conductively connected to one another by plated-through holes 34.

The chip 20 is contact-connected to the second regions 32 of the first conductor structures using flip-chip technology. Chip contacts of the chip 20 are positioned in a manner facing the substrate 10 and are connected to the conductor structures 32 via contact-connection elements, also referred to as bumps 80.

On the first side 11 of the substrate 10, the frame-type stiffening element 42 is positioned around the chip 2 between the first region 31 and the second region 32 of the conductor structures. It is arranged on a region of the first side 11 of the substrate 10 that is free of conductor structures 31, 32.

The moulding cap 60 encapsulates the chip 20, the stiffening element 42 and the second regions 32 of the conductor structures on the first side 11 of the substrate 10. The first regions 31 of the conductor structures are not encapsulated and are provided as contact regions for contact-connection, for example of an antenna. The chip 20 is connected to said contact regions 31 via the plated-through holes 34 and the second conductor structures 33 on the other, second side 12 of the substrate 10.

The conductor structures 31, 32, 33 have by way of example a thickness of approximately 25 μm. The chip 20 has a thickness of approximately 50 μm and the stiffening element 42 has a height of approximately 100 μm. The moulding cap rises approximately 125 μm above the top side of the first conductor structure 31 on the first side 11 of the substrate 10. The chip module has a thickness of approximately 200 μm.

During the production of such a chip module, in addition to the steps already described, the cutouts are to be introduced in the substrate, for example by laser cutting or stamping, and are to be filled with conductive material completely or at least continuously in the region of the walls of the cutouts. Furthermore, conductor structures are to be applied on both sides of the substrate.

In one exemplary embodiment, it is possible to form the second conductor structures on the second side as contact areas, such that the chip module has a contact-based interface.

In the exemplary embodiments illustrated in FIGS. 5 to 9, the stiffening elements 41, 42 are encapsulated. Consequently, the encapsulation forms an outer terminating region with a planar top side, which simplifies incorporation into the smart card. However, the moulding cap 60 is significantly thinner in regions between outer side and the stiffening element 42 than in other regions. Fractures of the moulding cap 60 can occur more easily in these regions.

Figure 10:
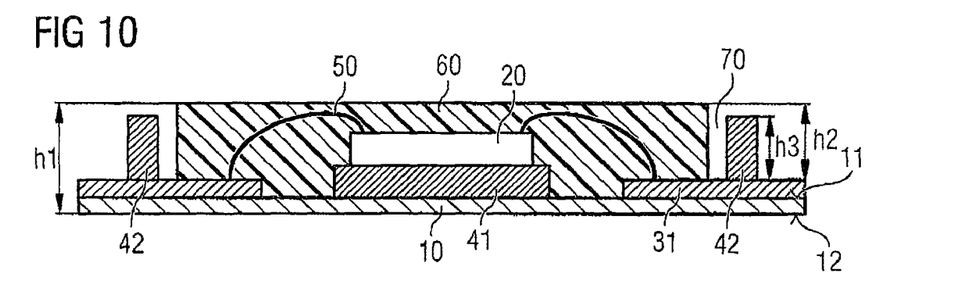

FIG. 10 shows an exemplary embodiment of a chip module in cross section. This comprises a substrate 1 having a first side 11 and a second side 12. Conductor structures 31 are applied on the first side 11 of the substrate 10. Furthermore, a plate-type first stiffening element 41 is provided, which is positioned between the chip 20 and the first side 11 of the substrate 10. The chip 20 is connected to the conductor structures 30 via bonding wires 50. A moulding cap 60 encapsulates the chip 20, the first stiffening element 42, the bonding wires 50 and regions of the conductor structures 31.

Furthermore, a frame-type second stiffening element 42 is provided, which is positioned on non-encapsulated regions of the conductor structures 31. The second stiffening element 42 is not encapsulated, but rather arranged around the moulding cap 60, such that a gap 70 is provided between the moulding cap 60 and the adjacent side of the second stiffening element 42.

The gap 70 is governed by production since firstly the encapsulation step is effected and then the second stiffening element 42 is applied around the moulding cap 60. As a result of positioning inaccuracies during the application of the stiffening element 42, it is conceivable that the gap 70 does not run around continuously. If the second stiffening element 42 is applied on edge regions of the moulding cap 60, however, shock forces can be transmitted to the moulding cap 60 and lead to moulding fracture.

It should be noted that, by analogy with the explanations concerning the exemplary embodiment in FIG. 7, instead of one frame-type second stiffening element 42 it is also possible for a plurality of second stiffening elements to be arranged around the moulding cap 60.

The first stiffening element 41 has a thickness of approximately 50 μm, as does the chip 20. The substrate 10 and the conductor structures 31 in each case have a thickness of approximately 25 μm. The total thickness h1 of the chip module is approximately 200 μm. The moulding cap 60 rises 150 μm above the top side of the conductor structures 31. The height h3 of the second stiffening element is less than the height h2 of the moulding cap 60.

Figure 11:
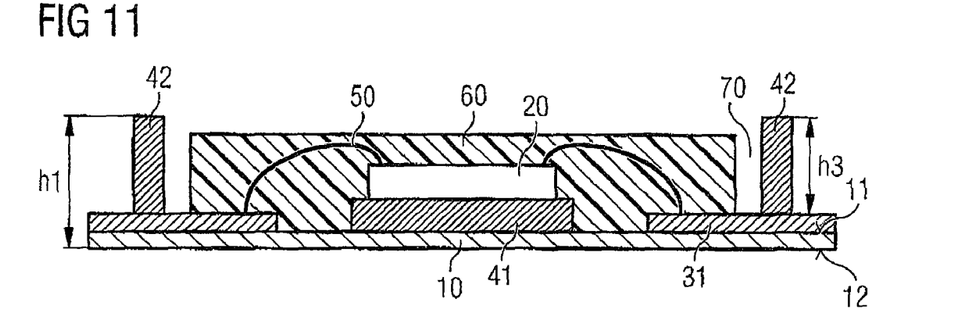

FIG. 11 shows an exemplary embodiment of a chip module in cross section which differs from the preceding exemplary embodiment by virtue of the fact that the second stiffening element 42 projects above the top side of the moulding cap 60. In this way, shocks are absorbed and moulding fracture is avoided.

The height h3 of the second stiffening element 42 is in the region of 150 μm, while the chip module thickness h1 is approximately 200 μm.

Given the same chip module thickness and also thickness of the substrate 1 and of the conductor structures 31, an exemplary embodiment with a second stiffening element 42 which projects above the moulding cap 60 has a thinner moulding cap 60 than an exemplary embodiment in which the second stiffening element 42 does not project above the moulding cap 60. The former exemplary embodiment affords better protection against moulding fracture in the event of shock or impact loading, whereas the latter exemplary embodiment has a more robust moulding cap 60.

Figure 12:
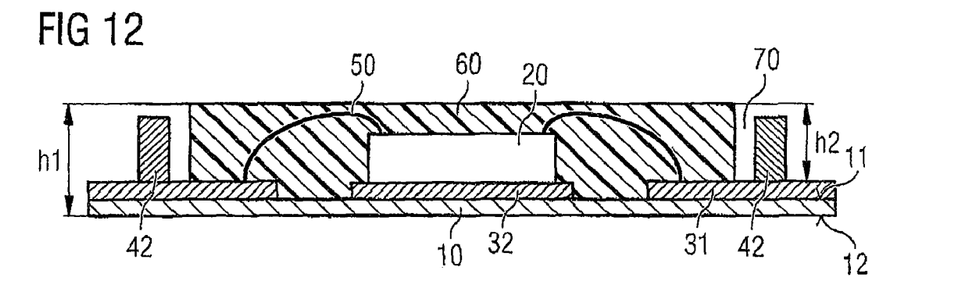

FIG. 12 schematically shows an exemplary embodiment of a chip module in cross section which differs from the exemplary embodiment in FIG. 6 merely by virtue of the fact that, instead of the first stiffening element, an insular conductor structure 32 is provided, to which the chip 20 is applied. This embodiment is suitable for higher chips 20, having a height of approximately 70 μm. The stiffening element 42 has a height of approximately 100 μm and does not project above the top side of the moulding cap 60.

Figure 13:
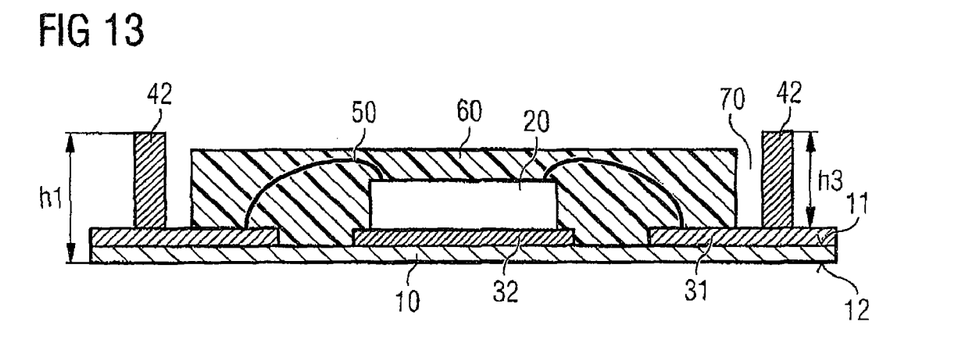

FIG. 13 schematically shows an exemplary embodiment of a chip module which differs from the preceding exemplary embodiment merely by virtue of the fact that the second stiffening element 42 projects beyond the top side of the moulding cap 60. It has a height h3 of 150 μm, for example. In this case, the height h1 of the chip module does not exceed 200 μm. The thickness of the moulding cap 60 is reduced in order not to increase the total height h1 of the chip module.

The exemplary embodiments in FIGS. 10 to 13 in each case comprise a stiffening element 42 outside the moulding cap 60. The size of the frame 42 surrounding the moulding body 60 means that a larger region of the chip module is protected than in the case of an encapsulated frame-type stiffening element.

The gap between moulding cap 60 and the frame-type stiffening element 42 should be dimensioned to be as small as possible in order that, after incorporation into the smart card, damage does not occur due to pointed objects, for example ballpoint pens, which get caught in the gap 70. With the chip module inserted, in the region of the gap 70 it is also possible for visible indentations to occur in the card layer applied above it. These effects can be avoided by means of, for example, a gap-filling material filling in the gap 70.

It should be noted that the features of the exemplary embodiments described are combined in further exemplary embodiments.

What is claimed is:

1. A chip module comprising:
   a substrate;
   a chip arranged on one side of the substrate;
   conductor structures arranged on at least one side of the substrate, conductively connected to the chip;
   at least one stiffening element arranged on one side of the substrate; and
   a moulding cap, configured to encapsulate at least the chip,
   wherein regions that are free of moulding material are provided between the moulding cap and the stiffening element or one of the stiffening elements.

2. The chip module according to claim 1, wherein the substrate is flexible.

3. The chip module according to claim 1, wherein the moulding cap encapsulates the stiffening element or one of the stiffening elements.

4. The chip module according to claim 1, wherein the stiffening element or one of the stiffening elements has a cavity in which the chip is positioned.

5. The chip module according to claim 1, wherein the stiffening element or one of the stiffening elements is arranged alongside the chip or around the chip.

6. The chip module according to claim 5, wherein the stiffening element or one of the stiffening elements is formed in frame-type fashion.

7. The chip module according to claim 1, wherein portions of the conductor structures are arranged between the stiffening element or one of the stiffening elements and the substrate.

8. A chip module comprising:
   a flexible substrate;
   a chip arranged on one side of the substrate;
   conductor structures arranged on at least one side of the substrate and conductively connected to the chip;
   at least one stiffening element arranged on one side of the substrate, wherein the stiffening element is configured to be arranged alongside or around the chip; and
   a moulding cap, configured to encapsulate at least the chip,
   wherein regions that are free of moulding material are provided between the moulding cap and the at least one stiffening element.

9. A chip module comprising:
   a flexible substrate;
   a chip arranged on one side of the substrate;
   conductor structures arranged on at least one side of the substrate and conductively connected to the chip;
   at least one stiffening element arranged on one side of the substrate, wherein the stiffening element is configured to be arranged alongside or around the chip; and
   a moulding cap, configured to encapsulate at least the chip,
   wherein a first distance between a side of the stiffening element or one of the stiffening elements that is remote from the substrate and a side of the substrate is greater than a second distance between a side of the moulding cap that is remote from the substrate and the same side of the substrate.

10. A chip module comprising:
    a flexible substrate;
    a chip arranged on one side of the substrate;
    conductor structures arranged on at least one side of the substrate and conductively connected to the chip;
    at least one stiffening element arranged on one side of the substrate, wherein the stiffening element is configured to be arranged alongside or around the chip; and
    a moulding cap, configured to encapsulate at least the chip,
    wherein a first distance between a side of the stiffening element or one of the stiffening elements that is remote from the substrate and a side of the substrate is less than a second distance between a side of the moulding cap that is remote from the substrate and the same side of the substrate.

11. A method for producing a chip module comprising:
    providing a substrate;
    applying conductor structures to at least one side of the substrate;
    mounting at least one stiffening element onto one side of the substrate;
    mounting a chip onto one side of the substrate;
    connecting the chip to the conductor structures; and
    applying a moulding compound on the substrate, such that the chip is covered,
    wherein the moulding compound is applied such that regions of the stiffening element or of one of the stiffening elements that face the chip remain free of moulding material.

* * * * *